US010056368B2

(12) United States Patent
Punchihewa et al.

(10) Patent No.: US 10,056,368 B2
(45) Date of Patent: Aug. 21, 2018

(54) FIN DIODE WITH INCREASED JUNCTION AREA

(71) Applicant: GLOBALFOUNDRIES Inc., Grand Cayman (KY)

(72) Inventors: Kasun Anupama Punchihewa, Ballston Lake, NY (US); Jagar Singh, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/686,523

(22) Filed: Aug. 25, 2017

(65) Prior Publication Data

US 2018/0006019 A1 Jan. 4, 2018

Related U.S. Application Data

(62) Division of application No. 15/139,644, filed on Apr. 27, 2016, now Pat. No. 9,793,262.

(51) Int. Cl.
*H01L 27/06* (2006.01)
*H01L 21/265* (2006.01)
(Continued)

(52) U.S. Cl.
CPC .... *H01L 27/0629* (2013.01); *H01L 21/26513* (2013.01); *H01L 21/823431* (2013.01);
(Continued)

(58) Field of Classification Search
CPC ........... H01L 27/062; H01L 21/823431; H01L 29/66136; H01L 29/0649; H01L 27/0814;
(Continued)

(56) References Cited

U.S. PATENT DOCUMENTS 8,682,116 B2 * 3/2014 Schulz ............... H01L 31/0232
250/214.1
9,318,621 B2 4/2016 Chang et al.
(Continued)

OTHER PUBLICATIONS

Singh et al., "Analog, RF, and ESD Device Challenges and Solutions for 14nm FinFET Technology and Beyond," 2014 Symposium on VLSI Technology Digest of Technical Papers, IEEE, 2014.
(Continued)

*Primary Examiner* — Jarrett Stark
(74) *Attorney, Agent, or Firm* — Amerson Law Firm, PLLC

(57) ABSTRACT

A diode includes a plurality of fins defined in a semiconductor substrate. An anode region is defined by a doped region in a first surface portion of each of the plurality of fins and in a second surface portion of the semiconductor substrate disposed between adjacent fins in the plurality of fins. The doped region includes a first dopant having a first conductivity type and is contiguous between the adjacent fins. A cathode region is defined by an inner portion of each of the plurality of fins positioned below and contacting the first surface portion and a third portion of the semiconductor substrate positioned below and contacting the second surface portion. The cathode region is contiguous and the dopants in the cathode region and anode region have opposite conductivity types. A junction is defined between the anode region and the cathode region. A first contact interfaces with the anode region.

10 Claims, 5 Drawing Sheets

(51) Int. Cl.
  *H01L 29/06*     (2006.01)
  *H01L 29/861*    (2006.01)
  *H01L 29/66*     (2006.01)
  *H01L 21/8234*   (2006.01)
  *H01L 27/08*     (2006.01)

(52) U.S. Cl.
  CPC ...... *H01L 27/0814* (2013.01); *H01L 29/0649* (2013.01); *H01L 29/0657* (2013.01); *H01L 29/66136* (2013.01); *H01L 29/861* (2013.01)

(58) Field of Classification Search
  CPC ........... H01L 29/0657; H01L 21/26513; H01L 29/861
  See application file for complete search history.

(56) References Cited

U.S. PATENT DOCUMENTS

| | | | | |
|---|---|---|---|---|
| 9,318,622 | B1* | 4/2016 | Logan | H01L 29/868 |
| 9,704,966 | B1* | 7/2017 | Singh | H01L 29/6609 |
| 9,960,248 | B2* | 5/2018 | Singh | H01L 29/6609 |
| 2008/0185691 | A1* | 8/2008 | Cheng | H01L 29/0649 |
| | | | | 257/656 |
| 2009/0085163 | A1 | 4/2009 | Russ et al. | |
| 2009/0280582 | A1 | 11/2009 | Thijs et al. | |
| 2010/0117043 | A1* | 5/2010 | Nam | G11C 13/0004 |
| | | | | 257/2 |
| 2013/0285208 | A1 | 10/2013 | Standaert et al. | |
| 2014/0077331 | A1* | 3/2014 | Hu | H01L 27/0629 |
| | | | | 257/499 |
| 2014/0124863 | A1 | 5/2014 | Cheng et al. | |
| 2014/0131831 | A1 | 5/2014 | Wei et al. | |
| 2016/0133469 | A1* | 5/2016 | Wan | H01L 21/26586 |
| | | | | 438/525 |
| 2018/0026113 | A1* | 1/2018 | Singh | H01L 29/6609 |
| 2018/0053758 | A1* | 2/2018 | Cheng | H01L 21/823437 |

OTHER PUBLICATIONS

Vertregt, "The analog challenge of nanometer CMOS," NXP Semiconductors Research, Endhoven, The Netherlands.
Wood et al., "Fin Doping by Hot Implant for 14nm FinFET Technology and Beyond," Abstract #2237, 224th ECS Meeting, The Electrochemical Society, 2013.

* cited by examiner

FIN DIODE WITH INCREASED JUNCTION AREA

BACKGROUND OF THE INVENTION

1. Field of the Invention

The present disclosure generally relates to the fabrication of semiconductor devices, and, more particularly, to a fin diode with increased junction area and methods for making same.

2. Description of the Related Art

In modern integrated circuits, such as microprocessors, storage devices and the like, a very large number of circuit elements, especially transistors, are provided and operated on a restricted chip area. Diodes are another common device found in many integrated circuits.

In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as finFET devices.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. A so-called finFET device has a three-dimensional (3D) structure.

A fin topology also provides the potential of increased density for diode devices. However, as fin sizes decrease, the dopant implantation process can damage the tip portions of the fin, resulting in increased defects and reduced junction area. The aspect ratio of the fins also makes it difficult to implant dopants on the lower portions of the fin, which also reduces the junction area.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One illustrative semiconductor diode includes, among other things, a plurality of fins defined in a semiconductor substrate. An anode region is defined by a doped region in a first surface portion of each of the plurality of fins and in a second surface portion of the semiconductor substrate disposed between adjacent fins in the plurality of fins. The doped region includes a first dopant having a first conductivity type and the doped region is contiguous between the adjacent fins. A cathode region is defined by an inner portion of each of the plurality of fins positioned below and contacting the first surface portion and a third portion of the semiconductor substrate positioned below and contacting the second surface portion. The cathode region is contiguous and comprises a material having a second dopant having a second conductivity type opposite the first conductivity type. A junction is defined between the anode region and the cathode region. A first contact interfaces with the anode region.

An illustrative device includes, among other things, a first plurality of fins having a first width positioned in a first region of a semiconductor substrate. A transistor is defined in the first region. A second plurality of fins has a second width greater than the first width and is positioned in a second region of the semiconductor substrate. A diode is defined in the second region. The diode includes an anode region defined by a doped region in a first surface portion of each of the second plurality of fins and in a second surface portion of the semiconductor substrate disposed between adjacent fins in the second plurality of fins. The doped region includes a first dopant having a first conductivity type and the doped region is contiguous between the adjacent fins. A cathode region is defined by an inner portion of each of the second plurality of fins positioned below and contacting the first surface portion and a third portion of the semiconductor substrate positioned below and contacting the second surface portion. The cathode region is contiguous. The cathode region includes a material having a second dopant having a second conductivity type opposite the first conductivity type. A junction is defined between the anode region and the cathode region. A first contact interfaces with the anode region.

BRIEF DESCRIPTION OF THE DRAWINGS

The disclosure may be understood by reference to the following description taken in conjunction with the accompanying drawings, in which like reference numerals identify like elements, and in which.

Figure 1A:
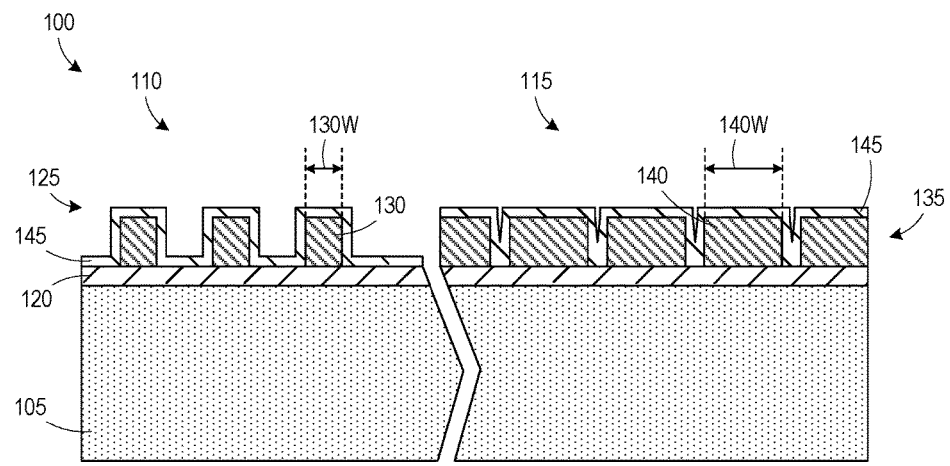
FIGS. 1A-1J depict various methods disclosed herein of forming a fin diode device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached FIGURES. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a fin diode device with increased junction area. As will be readily apparent to those skilled in the art upon a complete reading of the present application, the present method is applicable to a variety of devices, including, but not limited to, logic devices, memory devices, etc. With reference to the attached FIGURES, various illustrative embodiments of the methods and devices disclosed herein will now be described in more detail.

FIGS. 1A-1J illustrate various methods for forming an integrated circuit product 100 on a substrate 105. The product 100 includes a transistor region 110 and a diode region 115. FIGS. 1A-1J show a cross-sectional view perpendicular to a long axis of fins to be formed in the product 100 (i.e., in the gate width direction of transistors in the transistor region 110). The substrate 105 may have a variety of configurations, such as the depicted bulk silicon configuration. The substrate 105 may also have a silicon-on-insulator (SOI) configuration that includes a bulk silicon layer, a buried insulation layer and an active layer, wherein semiconductor devices are formed in and above the active layer. The substrate 105 may be formed of silicon or silicon germanium or it may be made of materials other than silicon, such as germanium. Thus, the terms "substrate" or "semiconductor substrate" should be understood to cover all semiconducting materials and all forms of such materials. The substrate 105 may have different layers. For example, the substrate 105 may include a process layer formed above a base layer.

As illustrated in FIG. 1A, a hard mask layer 120 is formed above the substrate 105. A first mandrel 125 having elements 130 with a first width 130W is formed above the hard mask layer 120 in the transistor region 110, and a second mandrel 135 having elements 140 with a second width 140W is formed above the hard mask layer 120 in the diode region 115. In some embodiments, the mandrels 125, 135 may be formed by patterning an amorphous silicon layer. A spacer layer 145 is formed above the mandrels 125, 130. The portions of the spacer layer 145 on the sidewalls of the elements 140 merge, in at least the region contacting the hard mask layer 120.

Figure 1B:
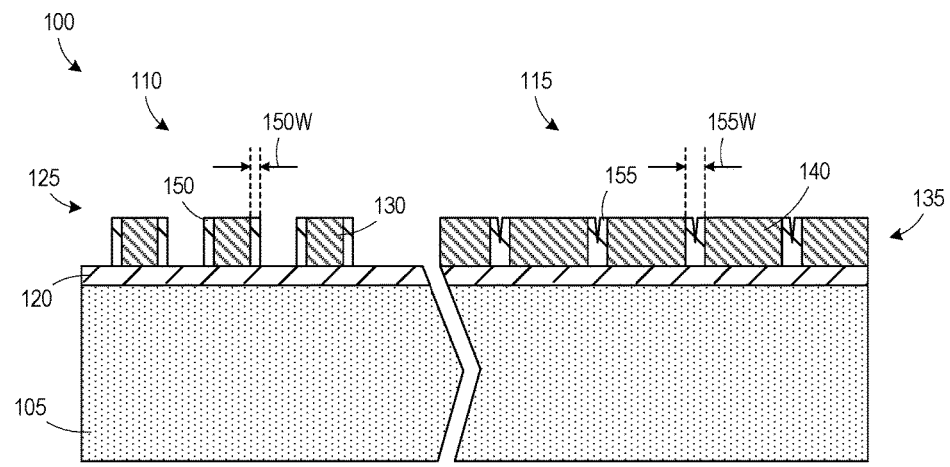

FIG. 1B illustrates the product 100 after an anisotropic etch process was performed on the spacer layer 145 to define spacers 150, 155 on the sidewalls of the elements 130, 140, respectively. Due to the merging of the spacer layer 145 proximate the elements 140, the spacers 155 have a width 155W approximately twice the width 150W of the spacers 150.

Figure 1C:
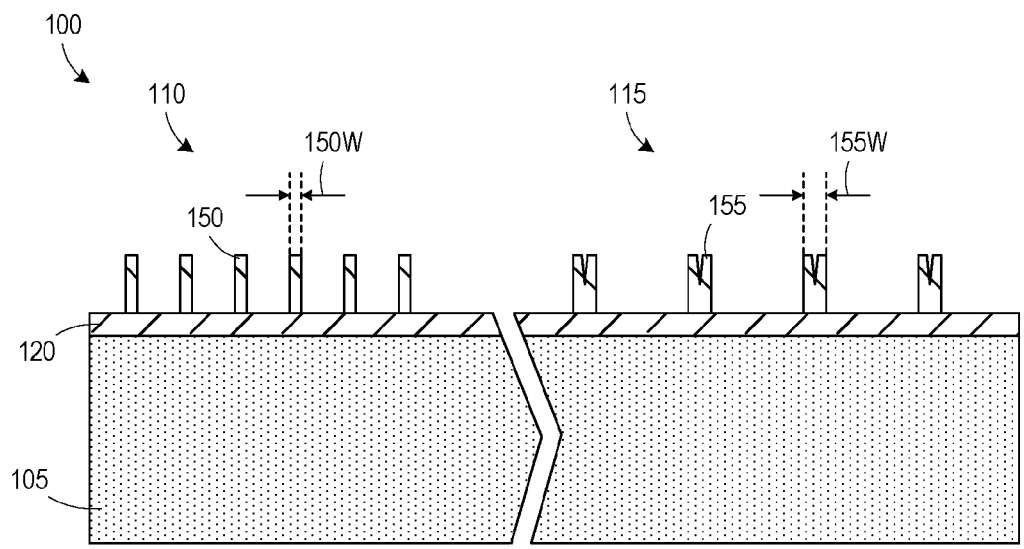

FIG. 1C illustrates the product 100 after an etch process was performed to remove the mandrels 125, 135.

Figure 1D:
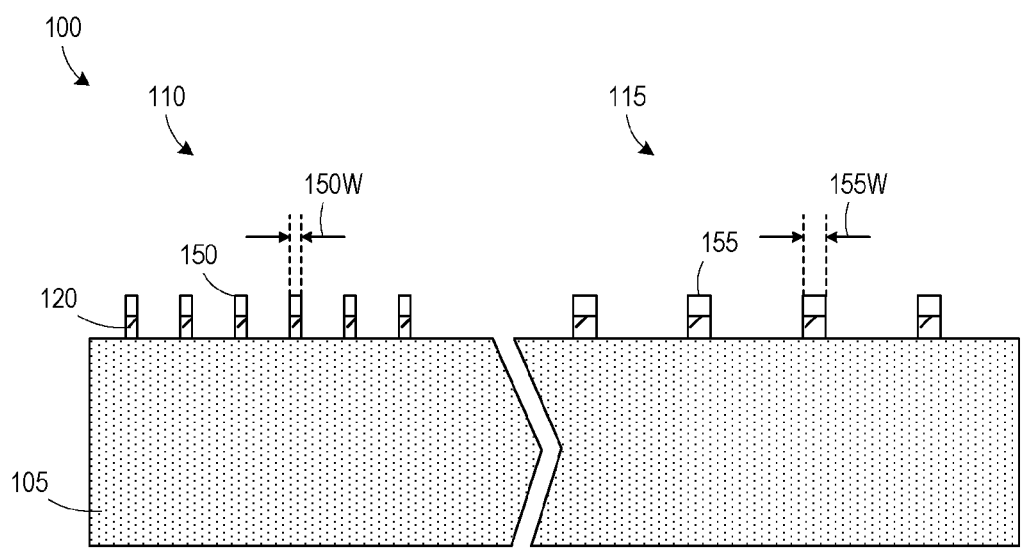

FIG. 1D illustrates the product 100 after an etch process was performed to pattern the hard mask layer 120 using the spacers 150, 155 as an etch mask.

Figure 1E:
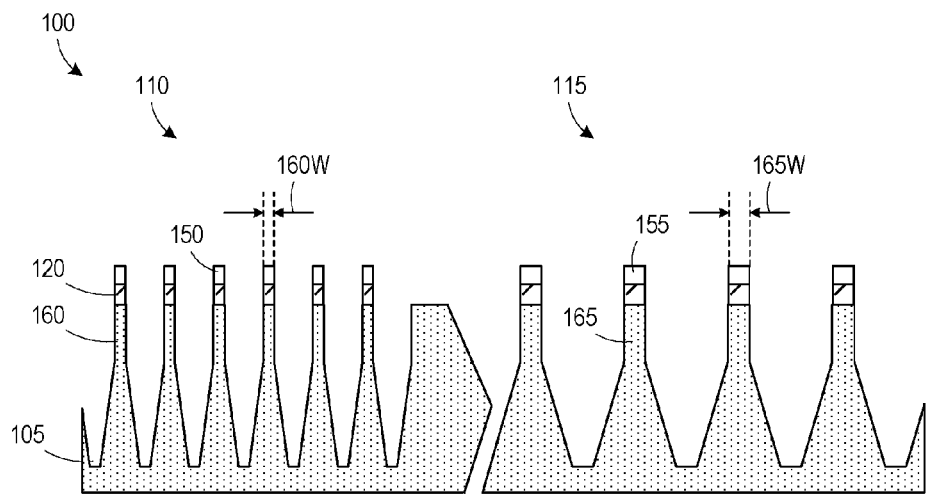

FIG. 1E illustrates the product 100 after an anisotropic etch process was performed to define fins 160 in the transistor region 110 of the substrate 105 and fins 165 in the diode region 115 of the substrate 105. The fins 165 have a width 165W that is approximately twice a width 160W of the fins 160. Hence, as compared to the fins 160, the fins 165 have a pitch and a width that are approximately double that of the fins 160.

Figure 1F:
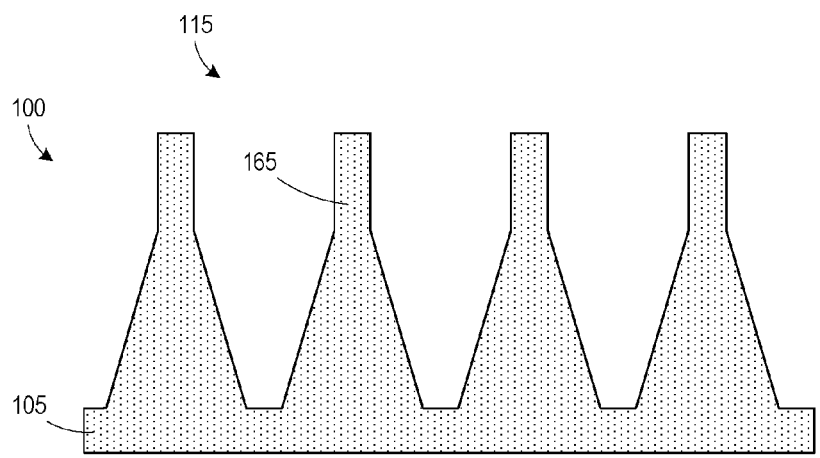

FIG. 1F illustrates the product 100 after one or more etch processes were performed to remove the remaining portions of the cap layer 120 and the spacers 150, 155. For ease of illustration, only the diode region 115 is illustrated in FIG. 1F. The subsequent steps illustrate the processing of the diode region 115. Separate processing may be performed to fabricate devices in the transistor region 110 with appropriate masking steps to separate the process flows for the regions 110, 115.

Figure 1G:
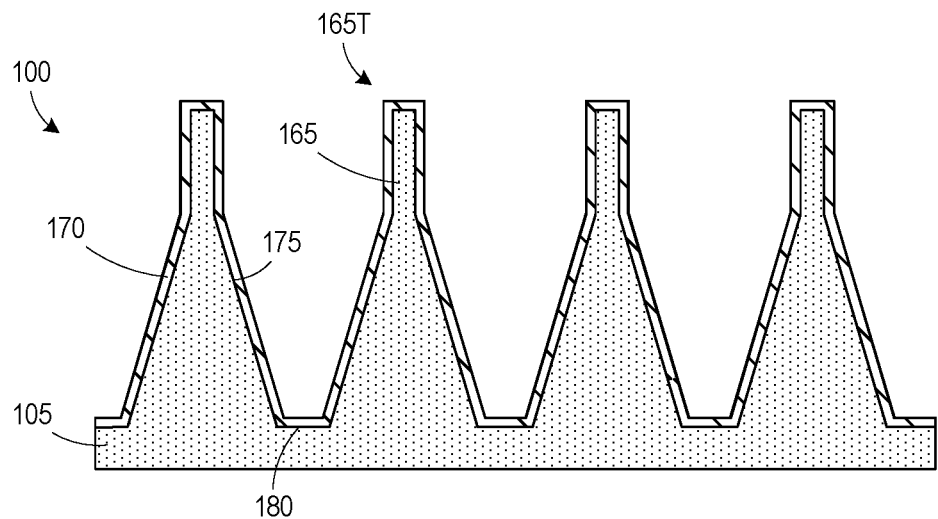

FIG. 1G illustrates the product 100 after an implantation process was performed to form a doped surface region 170 on the fins 165. The doped surface region 170 has the opposite dopant type as compared to the fins 165, thereby creating a PN junction 175 at the interface between the doped surface region 170 and the fins 165. The doped surface region 170 may define an anode region of a diode device and the portions of the fins opposite the PN junction 175 define a cathode region of the diode device. Providing the fins 165 with increased width and pitch allows the implantation process to reach the lower portions of the fins 165 and the surface portions 180 of the substrate 105, thereby providing that the PN junction 175 spans multiple fins 165. In addition, the increased width reduces the likelihood that the portions of the doped surface region 170 in tip regions 165T of the fins 165 will merge, thereby reducing the junction area. In some embodiments, the implantation process may be a hot implantation process, where the implantation is performed at an elevated temperature (e.g., >150° C.). In one embodiment, the implant energy may be between about 0.3-2 kV (e.g., 0.6 kV) and the dose may be between about $1E15/cm^2$ and $2E16/cm^2$ (e.g., $2E15/cm^2$).

Figure 1H:
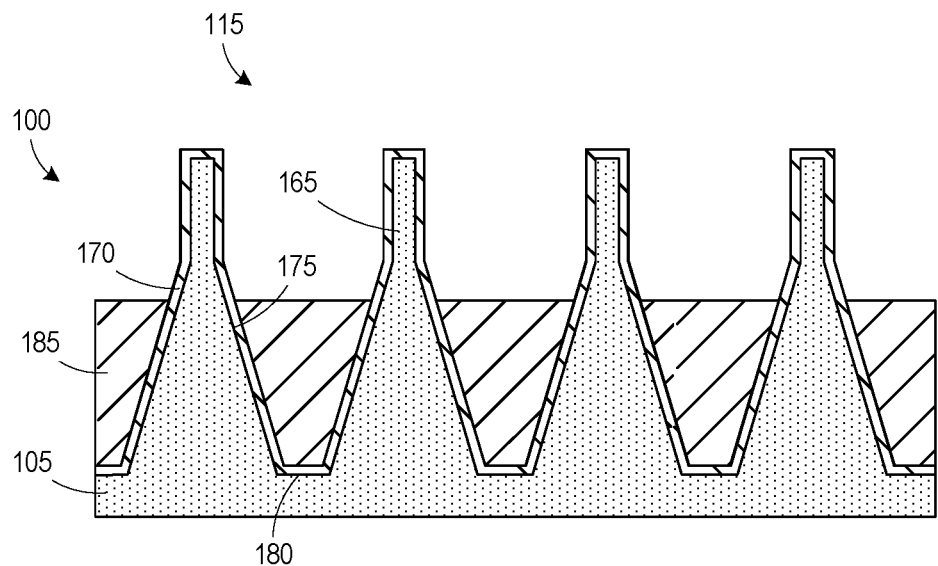

FIG. 1H illustrates the product 100 after a plurality of processes was performed to define an isolation structure 185 between the fins 165. A deposition process was performed to deposit a dielectric material and an etch process was performed to recess the dielectric material to expose upper portions of the fins 165. These processes may also be performed to define similar isolation structures (not shown) in the transistor region 110. In some embodiments, one or more liner layers (e.g., silicon nitride, silicon dioxide or a stack thereof) (not shown) may be formed above the fins 165 prior to forming the isolation structure 185. Any such liners may be removed after the recessing of the dielectric material.

Figure 1I:
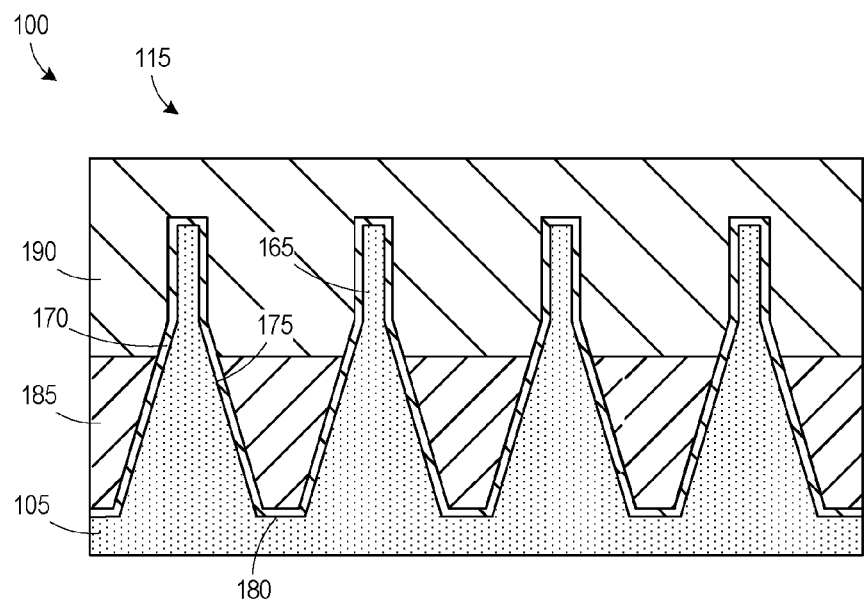

FIG. 1I illustrates the product 100 after a plurality of processes was performed to form a contact structure 190 (e.g., anode contact) interfacing with the doped surface region 170. The processes may include one or more deposition processes to form one or more conductive layers (e.g., barrier layers, seed layers, fill layers) that will be part of the contact structure 190 (layers not separately shown). The conductive material may be planarized.

Figure 1J:
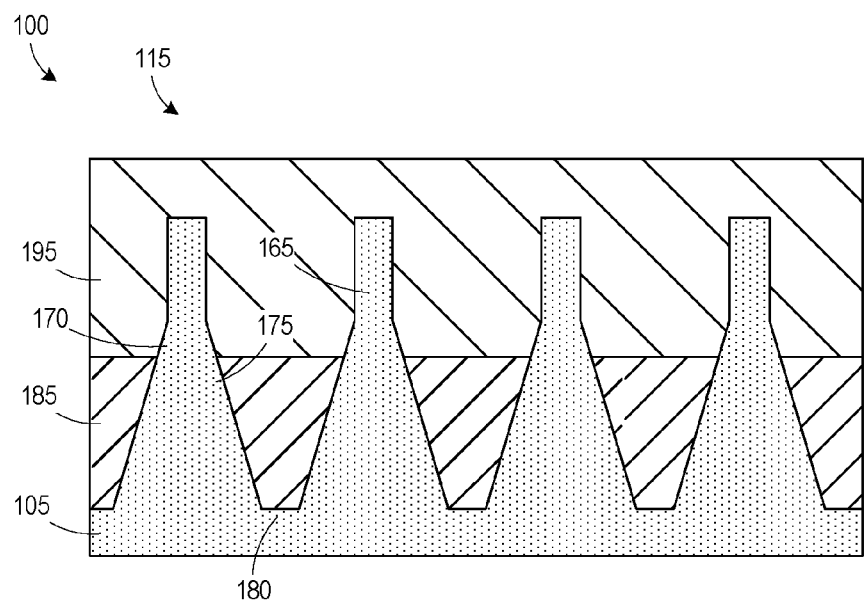

FIG. 1J illustrates the product 100 after a plurality of processes was performed to form a contact structure 195 (e.g., cathode contact) interfacing with an undoped region of the fins 165. The processes may include one or more deposition processes to form one or more conductive layers (e.g., barrier layers, seed layers, fill layers) that will be part of the contact structure 195 (layers not separately shown). The conductive material may be planarized.

The processes to form the contact structures 190, 195 may be integrated with the processes for forming gate electrodes or contacts in the transistor region 110. For example, if the processes are part of the gate electrode process, a gate insulation layer (not shown) (e.g., silicon dioxide, hafnium oxide or a high-k material) may be formed in both regions 110 and 115, and the gate insulation layer may be selectively removed in the diode region 115 prior to forming the conductive material.

Although line type contact structures 190, 195 are illustrated, in some embodiments, via or plug type contacts may be used.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A diode, comprising:
    a plurality of fins defined in a semiconductor substrate;
    an anode region defined by a doped region in a first surface portion of each of the plurality of fins and in a second surface portion of said semiconductor substrate disposed between adjacent fins in said plurality of fins, wherein said doped region comprises a first dopant having a first conductivity type and said doped region is contiguous between said adjacent fins;
    a cathode region defined by an inner portion of each of said plurality of fins positioned below and contacting said first surface portion and a third portion of said semiconductor substrate positioned below and contacting said second surface portion, wherein said cathode region is contiguous, said cathode region comprises a material having a second dopant having a second conductivity type opposite said first conductivity type, and a junction is defined between said anode region and said cathode region; and
    a first contact interfacing with said anode region.

2. The diode of claim 1, further comprising an isolation structure positioned between said adjacent fins that does not extend above upper portions of said plurality of fins.

3. The diode of claim 2, wherein said first contact interfaces with said upper portions of said plurality of fins.

4. The diode of claim 1, further comprising a second contact interfacing with said cathode region.

5. The diode of claim 4, wherein said second contact is positioned in a region of said plurality of fins not including said doped region.

6. A device, comprising:
    a first plurality of fins having a first width positioned in a first region of a semiconductor substrate;
    a transistor defined in said first region;
    a second plurality of fins having a second width greater than said first width positioned in a second region of said semiconductor substrate; and
    a diode defined in said second region, said diode comprising:
        an anode region defined by a doped region in a first surface portion of each of said second plurality of fins and in a second surface portion of said semiconductor substrate disposed between adjacent fins in said second plurality of fins, wherein said doped region comprises a first dopant having a first conductivity type and said doped region is contiguous between said adjacent fins;
        a cathode region defined by an inner portion of each of said second plurality of fins positioned below and contacting said first surface portion and a third portion of said semiconductor substrate positioned below and contacting said second surface portion, wherein said cathode region is contiguous, said cathode region comprises a material having a second dopant having a second conductivity type opposite said first conductivity type, and a junction is defined between said anode region and said cathode region; and
        a first contact interfacing with said anode region.

7. The device of claim 6, wherein said diode further comprises an isolation structure positioned between adjacent fins of said second plurality of fins that does not extend above upper portions of said second plurality of fins.

8. The device of claim 7, wherein said first contact interfaces with said upper portions of said plurality of fins.

9. The device of claim 6, further comprising a second contact interfacing with said cathode region.

10. The device of claim 9, wherein said second contact is positioned in a region of said second plurality of fins not including said doped region.

\* \* \* \* \*